United States Patent
Thomas et al.

(10) Patent No.: US 7,713,766 B2
(45) Date of Patent: May 11, 2010

(54) LIGHT SENSOR LOCATED ABOVE AN INTEGRATED CIRCUIT

(75) Inventors: Danielle Thomas, Saint Ismier (FR);
Maurice Rivoire, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 12/275,494

(22) Filed: Nov. 21, 2008

(65) Prior Publication Data

US 2009/0075410 A1 Mar. 19, 2009

Related U.S. Application Data

(62) Division of application No. 11/323,074, filed on Dec. 30, 2005, now Pat. No. 7,492,026.

(30) Foreign Application Priority Data

Dec. 30, 2004 (FR) .................................. 04 53264

(51) Int. Cl.
*H01L 31/00* (2006.01)
(52) U.S. Cl. ........................... 438/22; 438/48; 257/444; 257/458; 257/E31.057; 257/E31.125
(58) Field of Classification Search ............... 438/48, 438/22; 257/444, 458, 430–431, 290–294
See application file for complete search history.

(56) References Cited

U.S. PATENT DOCUMENTS

| | | | |
|---|---|---|---|
| 5,936,261 A | 8/1999 | Ma et al. | |
| 6,252,218 B1 | 6/2001 | Chou | |
| 6,459,450 B2 | 10/2002 | Bawolek et al. | |
| 6,709,885 B2 | 3/2004 | Uppal et al. | |
| 6,759,724 B2 | 7/2004 | Cao et al. | |
| 7,279,729 B2 | 10/2007 | Roy | |
| 2003/0213915 A1 | 11/2003 | Chao et al. | |
| 2004/0266053 A1* | 12/2004 | Varghese | 438/94 |
| 2005/0224707 A1* | 10/2005 | Guedj et al. | 250/239 |
| 2006/0145282 A1 | 7/2006 | Thomas et al. | |

FOREIGN PATENT DOCUMENTS

FR   2841382   * 12/2003

OTHER PUBLICATIONS

French Search Report dated Sep. 16, 2005, from French Patent Application No. 04/53264, filed Dec. 30, 2004.

* cited by examiner

*Primary Examiner*—Ahmed Sefer
(74) *Attorney, Agent, or Firm*—Lisa K. Jorgenson; James H. Morris; Wolf, Greenfield & Sacks, P.C.

(57) ABSTRACT

A light sensor located above an integrated circuit including a lower electrode, a heavily-doped amorphous silicon layer of a first conductivity type, and a lightly-doped amorphous silicon layer of a second conductivity type. The lightly-doped amorphous silicon layer rests on a planar surface at least above and in the vicinity of the lower electrode.

13 Claims, 3 Drawing Sheets

LIGHT SENSOR LOCATED ABOVE AN INTEGRATED CIRCUIT

CROSS REFERENCE TO RELATED APPLICATIONS

This application is a division of prior application Ser. No. 11/323,074, filed on Dec. 30, 2005, now U.S. Pat. No. 7,492,026 entitled "Light Sensor Located Above An Integrated Circuit" which application claims the priority benefit of French patent application number 04/532624, filed on Dec. 30, 2004, entitled "Light Sensor Located Above An Integrated Circuit" which applications are hereby incorporated by reference to the maximum extent allowable by law.

BACKGROUND OF THE INVENTION

1. Field of the Invention

The present invention relates to the field of micro-electronics and more specifically to light sensors associated with an integrated circuit.

2. Discussion of the Related Art

Light sensors are devices which enable turning light signal into an electric signal. Several millions of these sensors can be distributed on a surface to create an electric image comprising millions of points. Usually, a sensor is formed of a light-emitting diode and of a MOS circuit enabling collecting and processing the electric signal issued by the light-emitting diode.

The light-emitting diode may be formed of single-crystal silicon. In this case, the MOS circuit and the light-emitting diode coexist in a single-crystal silicon substrate and are located substantially in the same plane. The MOS transistors which enable collection of the electric current of the light-emitting diodes are located between the light-emitting diodes. Such an architecture is expensive since the surface area taken up in the silicon is the sum of the surface areas of the light-emitting diodes and of the MOS transistors. It has a low performance since not all the light reaches the light-emitting diodes and part of it is lost between the light-emitting diodes. The light hitting the light-emitting diodes is likely to diffuse and to disturb the operation of the MOS transistors adjacent to the light-emitting diodes.

Another solution consists of forming the light-emitting diodes above the integrated circuit comprising the MOS transistors. Such a structure is described in U.S. patent application 2004/0135209. FIG. 1 shows a structure corresponding to this US application. An integrated circuit is formed in a substrate 1. An insulating layer 2 comprising metal interconnects is formed above the integrated circuit. The light-emitting diodes are formed above the insulating layer. The light-emitting diodes comprise a lower titanium nitride (TiN) electrode 3 and an upper indium and tin oxide (ITO) electrode 4 transparent to light. The lower electrode is in electric contact with a P-type doped amorphous silicon layer 5 located above. The upper electrode is in electric contact with an underlying N-type doped amorphous silicon layer 6. These two P- and N-type doped amorphous silicon layers are separated by a lightly-doped N-type amorphous silicon layer. Thus, the structure of FIG. 1 is formed of a vertical PN-type amorphous silicon light-emitting diode having its lower electrode connected to a region 8 of the integrated circuit by a via 9 made of a conductive material.

In this type of architecture, the space lost between the light-emitting diodes is minimum, which enables collecting a maximum light signal for a minimum occupied surface area. It is further possible to use the entire surface of the underlying silicon to achieve complex electronic functions such as, for example, the image storage and processing. The light-emitting diode, made of amorphous silicon, exhibits a chromatic response substantially equivalent to that of the human eye. Such is not the case for the light-emitting diodes formed of single-crystal silicon which are particularly sensitive to infra-red wavelengths. This chromatic response enables simplifying the arrangement of the color filters in the case where a light-emitting diode matrix capable of rendering a color image is desired to be formed.

However, up to now, such architectures result in low performance for the light sensor, in particular in low light. To collect the current generated by the light-emitting diode, the light-emitting diode junction must be reverse-biased. The light signal creates carriers close to the PN junction of the light-emitting diode. Such carriers are collected in the space charge area of the reverse-biased junction and then form a photocurrent which is processed by the underlying integrated circuit. The reverse biasing of the junction also generates a leakage current, called a dark current, which is a parasitic current. In the case of the light-emitting diode of FIG. 1, this dark current is greater by several decades than that obtained in the case of a light-emitting diode formed in single-crystal silicon. Under such conditions, the current generated by the light for low lightings is on the same order of magnitude as the dark current. The sensitivity of the sensor for low lighting levels is low. This requires, in the case of patent application No. US2004/0135209, implementing specific means to compensate for this dark current ("dark reference average circuit", FIG. 8 of the US application).

SUMMARY OF THE INVENTION

An object of the present invention is to provide a light sensor integrable above an integrated circuit and exhibiting optimal electric qualities, that is, both a chromatic response substantially similar to that of the human eye and a minimum dark current.

Another object of the present invention is to provide such a light sensor that can be formed with as few technological steps as possible.

Another object of the present invention is to provide such a light sensor exhibiting a high density of light-emitting diodes of minimum size and comprising color filters which are easy to form.

To achieve these and other objects, the present invention provides a light sensor located above an integrated circuit comprising a lower electrode, a heavily-doped amorphous silicon layer of a first conductivity type, and a lightly-doped amorphous silicon layer of a second conductivity type. The lightly-doped amorphous silicon layer rests on a planar surface at least above and in the vicinity of the lower electrode.

According to an embodiment of the present invention, the light sensor comprises a lower chromium electrode in electric contact with the lightly-doped amorphous silicon.

According to an embodiment of the present invention, the light sensor comprises an upper ITO electrode in electric contact with heavily-doped amorphous silicon.

According to an embodiment of the present invention, the interfaces between the electrodes and the amorphous silicon layers are planar.

According to an embodiment of the present invention, the lower electrode is in contact with heavily-doped P-type amorphous silicon.

According to an embodiment of the present invention, the upper electrode is in electric contact with a heavily-doped N-type amorphous silicon layer.

The present invention also aims at an image sensor formed of light-emitting diodes such as mentioned hereabove.

According to an embodiment of the present invention, the repetition step of the light-emitting diodes is smaller than 1.5 µm.

The present invention also aims at a communicating object comprising an image sensor such as mentioned hereabove.

The present invention also aims at a method for forming a light sensor located above an integrated circuit comprising the steps of forming an integrated circuit comprising at its upper surface a first insulating component; depositing a second insulating layer; creating cavities across the thickness of the second insulating layer; depositing a metal, making the surface planar to leave the metal only in the cavity and to obtain a planar surface above and close to the cavity; depositing an amorphous silicon layer; depositing a doped silicon layer; and depositing an electrode layer.

The foregoing objects, features, and advantages of the present invention will be discussed in detail in the following non-limiting description of specific embodiments in connection with the accompanying drawings.

DETAILED DESCRIPTION

As usual in the representation of integrated circuits, the scales are not respected in the different cross-section views to better show the different layers and elements of the devices.

Figure 1:
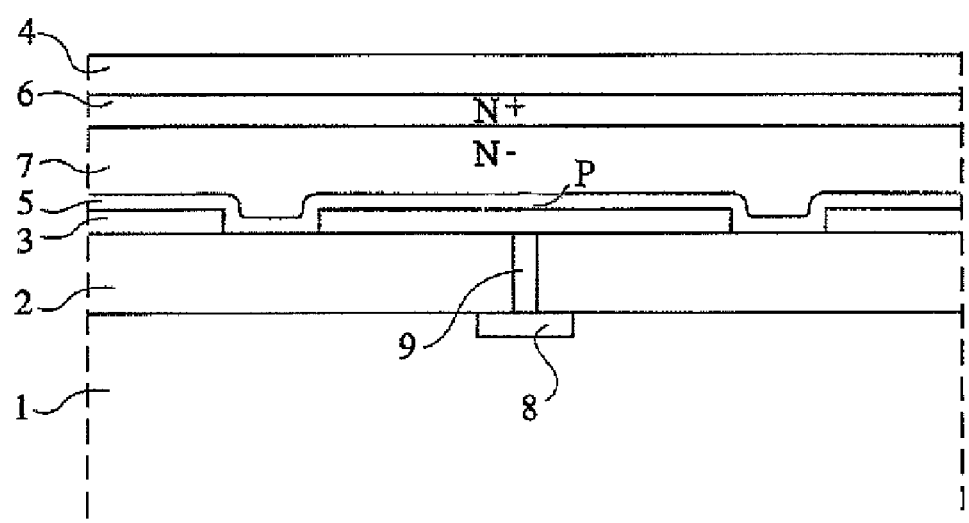
FIG. 1 shows an integrated light sensor above an integrated circuit of prior art.
Figure 2:
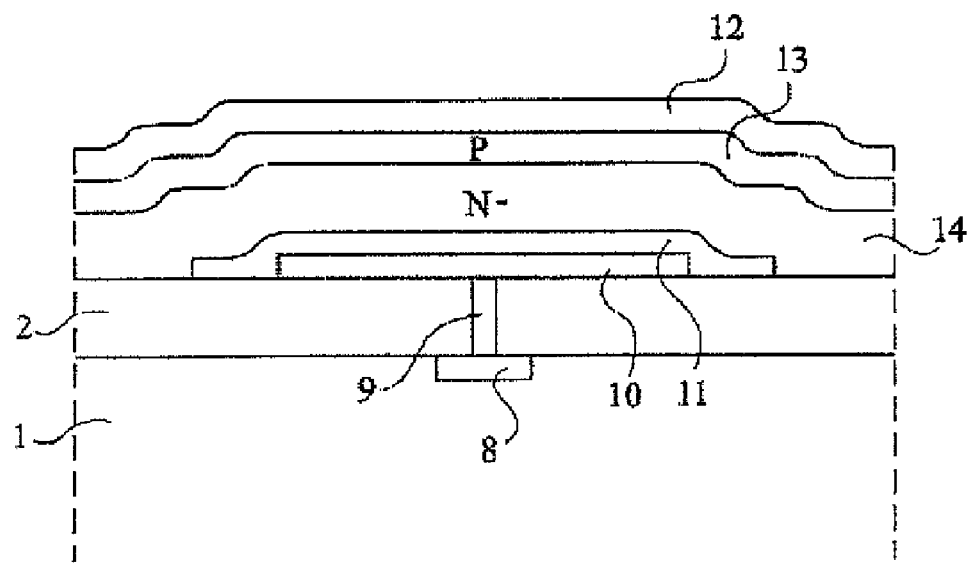
FIG. 2 shows an integrated light sensor above an integrated circuit.

In an attempt to simplify the prior art structure illustrated in FIG. 1, the applicant has formed the structures shown in FIG. 2. FIG. 2 describes an integrated circuit formed in a substrate 1. An insulating layer 2, comprising metal interconnects, is formed above the circuit. Above insulating layer 2 are formed the light-emitting diodes. The light-emitting diodes comprise a lower electrode 10 formed of a titanium nitride layer (TiN) entirely covered with a chromium layer 11 and an upper indium and tin oxide (ITO) electrode 12. The upper electrode is in electric contact with an underlying P-type doped amorphous silicon 13. Between electrode 11 and the P-doped amorphous silicon layer, a lightly-doped N-type amorphous silicon layer 14 has been formed. Thus, the structure of FIG. 2 likely to sense a light signal is formed of a vertical NP-type amorphous silicon light-emitting diode. The contact on the N area is a Schottky contact ensured by the chromium. The first lower electrode is connected to a region 8 of the integrated circuit by a via 9 made of a conductive material.

The operation of this light-emitting diode is similar to that of the light-emitting diode of prior art. It can be seen that, despite changes in the light-emitting diode structure, the dark current is still significant and even greater than that measured in prior art.

Figure 3:
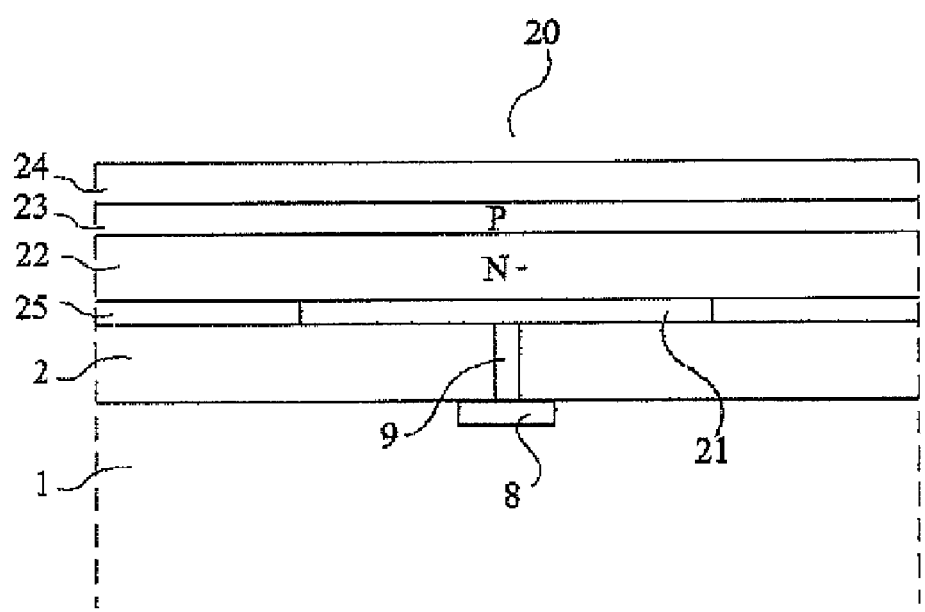
FIG. 3 shows an integrated light sensor above an integrated circuit according to an embodiment of the present invention.

FIG. 3 provides, according to an embodiment of the present invention, a novel light-emitting diode structure above an integrated circuit formed in a substrate 1. An insulating layer 2, comprising the metal interconnects, is formed above the integrated circuit. Above insulating layer 2 is formed a light-emitting diode 20 which forms the light sensor. This light-emitting diode successively comprises, from bottom to top, a lower electrode 21, a first lightly-doped N-type amorphous silicon area 22, a second P-type doped amorphous silicon 23, and an upper electrode 24. Lower electrode 21 is surrounded with an insulator layer 25 of same thickness. The width of lower electrode 21 is smaller than 3 µm, and preferably on the order of 1.5 µm. As seen from above, lower electrode 21 has a square shape but any other shape is possible.

Lower electrode 21 is preferably made of chromium which exhibits a barrier height with respect to amorphous silicon 22 capable of ensuring an electric contact with the lightly-doped N-type amorphous silicon. Those skilled in the art know that an electric contact can also be formed, for example, with a metal and an intermediary heavily-doped N-type silicon layer. In such a case, the forming method is more complex, but the use of chromium, which can exhibit a low adherence on oxide, is avoided. In the illustrated embodiment, this chromium adherence problem is solved by the decrease in the dimensions of the lower electrode and by the fact that the lower electrode is embedded in an insulator layer. Lower electrode 21 is electrically connected to a region 8 of the integrated circuit by a via 9 made of a conductive material.

First amorphous silicon layer 22 is not doped during the deposition. There however exists a natural N-type doping. This amorphous silicon deposited at low temperature (under 200° C.) does not exhibit clusters of measurable size.

Second amorphous silicon layer 23 is P-type doped.

ITO upper electrode 24 is connected to the integrated circuit by a metal connection not shown.

Light-emitting diode 20 of FIG. 3 comprises an NP junction between first amorphous silicon 22 and second amorphous silicon 23. This junction is reverse-biased by the underlying integrated circuit. When the light-emitting diode is lit, carriers are generated in lightly-doped amorphous silicon 22 and are then collected by the space charge area of the NP junction. This results in a photocurrent directed towards the integrated circuit by conductive via 9.

The structures of FIGS. 2 and 3 are similar. The dark current measured on the diode of FIG. 2 is on the order of 100 pA/cm$^2$ for a 2-volt reverse voltage. However, the dark current measured on the diode of FIG. 3 is on the order of 10 pA/cm$^2$ for a 2-V reverse voltage. This value is 10 times smaller than the former; the light-emitting diode performances are thus significantly improved.

There is no simple explanation for this significant decrease in the dark current. The present inventors however consider that the high dark current of prior art is linked to the presence of drops in the amorphous silicon layer. The device of FIG. 3 is planar and the amorphous silicon in region 22, at the level of the edge of electrode 21 is deposited and rests freely on a planar surface. Such is not the case for the devices of FIGS. 1 and 2 in which the amorphous silicon at the level of the edges of electrodes 3 or 10 and 11 is deposited on a surface exhibiting steps due to the electrode etchings. The amorphous silicon is not very stable and its crystal structure varies according to the relief on which it rests. Silicon clusters having a size ranging between 8 and 20 nm may form locally either during the depositing of amorphous silicon or after this deposition. The electric results indicate that such clusters induce an additional dark current. In the case of FIGS. 1 and 2, the dark current would then have its source at the periphery of the light-emitting diodes.

The present invention provides for the amorphous silicon to rest on a planar surface across its entire useful surface and at least at the immediate periphery of this useful surface. A surface obtained by a chem.-mech polishing is considered as planar in the context of the present invention. A layer deposited on a surface exhibiting steps greater than 20 nm is considered as non-planar in the context of the present invention.

Figure 4:
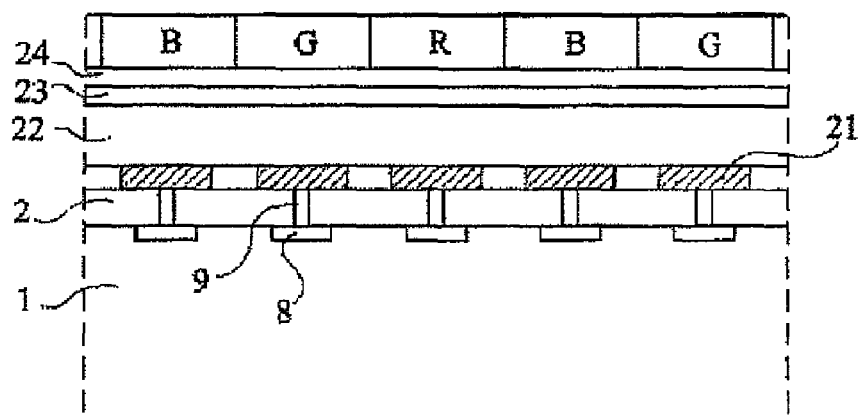
FIG. 4 shows an image sensor formed above an integrated circuit according to the present invention.

FIG. 4 shows, according to the present invention, an image sensor formed above an integrated circuit and obtained from the light-emitting diodes shown in FIG. 3. This sensor is formed of several millions of light-emitting diodes which comprise a plurality of lower electrodes 21 connected to the integrated circuit by conductive vias 9. An amorphous silicon layer 22 rests on a planar surface extending over the entire area taken up by the lower electrodes. The image sensor structure is completed by a layer 23 formed of P-doped amorphous silicon and by an ITO layer 24. To obtain a color image, the filter portions colored in blue B, green G, red R, are deposited and etched above each lower electrode.

It has been seen hereabove that, in the opinion of the present inventors, the dark current is generated by the periphery of the light-emitting diodes. According to the present invention, this contribution to the dark current has been suppressed. It is then possible to significantly decrease the surface of each light-emitting diode while keeping a high ratio between the photocurrent and the dark current. The lower electrode being embedded in insulator, it is no longer useful to use a bonding layer such a titanium nitride shown in FIG. 2. The distance to be respected for the covering of the titanium nitride with chromium becomes aimless. The structure provided by FIG. 4 is particularly dense. The repetition threshold of the lower electrodes may reach 1.5 µm. A significant density of sensors can thus be obtained with a very good quality.

The B, G, R color filters must however also be formed according to the sensor step. These filters are formed from negative photosensitive resists which, once insolated, remain on the image sensor. Such resins are particularly sensitive to parasitic reflections of the light on the sides exhibited by the underlying layers. In other words, to obtain a good definition for these negative resins, it is necessary to have perfectly planar underlying surfaces. This is performed according to the present invention without using an intermediary layer capable of making the surface planar.

The integrated circuit underlying the image sensor may be an integral part of a communication object such as a digital photographic camera, a fax, a portable phone, or a laptop computer. The integrated circuit may also actively take part in the operation of the communication object in which it is inserted.

An embodiment of light-emitting diodes according to FIG. 3 or 4 is the following, the numerical values being indicated as an example only:

forming an integrated circuit comprising a TiN-type insulating upper layer, for example;

depositing a TEOS oxide layer with a thickness from 200 to 500 nm;

digging a cavity intended to receive the lower electrode;

substantially at the center of this cavity, digging a via down to an internal conductive layer of the integrated circuit;

depositing a chromium layer of a thickness ranging between 300 and 800 nm to fill the cavity and the via;

performing a CMP step to disengage the upper surface of the TEOS oxide and to leave the chromium only in the cavities and the vias;

depositing an undoped amorphous silicon layer with a thickness ranging between 0.35 and 1.3 µm, and preferably with a thickness equal to 0.45 µm, the natural doping of this layer being of type N and preferably smaller than $5.10^{14}$ at/cm$^3$;

depositing a P-type doped amorphous silicon layer with a thickness ranging between 10 and 30 nm with a boron concentration greater than $10^{18}$ at/cm$^3$, where the dopant can be brought during the deposition by trimethylborane (TMB);

depositing by PVD an ITO layer with a thickness of approximately 80 nm;

depositing a green negative-type resist of a thickness of approximately 1 µm, and etching it; and depositing red and blue resists in the same conditions as hereabove, and etching them.

The present invention is likely to have various alterations, modifications, and improvements which will readily occur to those skilled in the art. In particular, the metal of the lower electrode may be different, intermediary amorphous silicon layers may be added, the dopings of the amorphous silicon layers may be modified.

Figure 5:
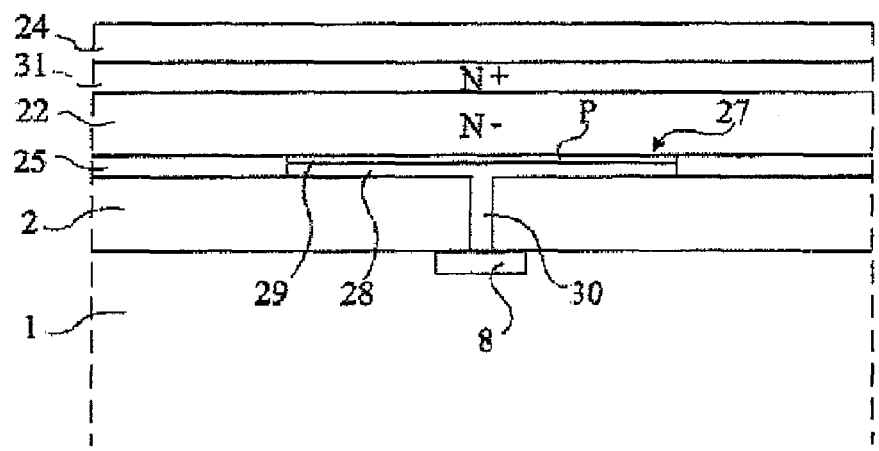
FIG. 5 shows an integrated light sensor above an integrated circuit according to another embodiment of the present invention.

FIG. 5 illustrates another embodiment of the present invention. An integrated circuit is formed in a substrate 1 and comprises diffused conductive areas 8. The interconnects of this integrated circuit are formed in various insulator layers 2 deposited above the integrated circuit. An insulating layer 25 rests above insulating layer 2. Cavities 27 in this layer 25 successively contain a very conductive material 28 and heavily-doped P-type amorphous silicon 29. Conductive material 28 may be a metal, titanium nitride, or any other conductive material. It is preferably directly in electric contact with conductive area 8 of the integrated circuit via a via 30. The surface above layer 25 is planar. The cavities are filled so that the upper surface of layer 29 is substantially at the same level as the surface of insulator 25. A lightly-doped N-type silicon layer 22 rests on this planar surface. The structure of the light-emitting diode is then completed with an N-type heavily-doped amorphous silicon layer 31 and with an upper ITO electrode.

The light-emitting diode is formed by the junction of the P-type and N-type amorphous silicon materials 29 and 22. Heavily-doped N-type amorphous silicon layer 31 is used to obtain an ohmic contact of upper electrode 24 with lightly-doped amorphous silicon 22.

This structure can be made out from those of prior art shown in FIG. 1 by the planeness of the different amorphous silicon layers. The dark current of the structure of FIG. 5 is minimum since according to the present invention, amorphous silicon 22 is deposited on a planar surface. Another advantage as compared to prior art is a better density and a better insulation of the P-type amorphous silicon 29 embedded in an insulator.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming a light sensor located above an integrated circuit comprising the steps of:

forming an integrated circuit comprising at its upper surface a first insulating component;

depositing a second insulating layer;

creating a cavity across the thickness of the second insulating layer;

depositing a metal in the cavity to form a lower electrode having an upper surface such that the lower electrode's upper surface is planar wit the second insulating layer;

depositing an amorphous silicon layer such that the amorphous silicon layer contacts the entire upper surface of the lower electrode;

depositing a doped silicon layer; and depositing an upper electrode layer.

2. The method of claim 1, wherein the amorphous silicon layer is a lightly-doped amorphous silicon layer.

3. The method of claim 1, wherein the cavity has a width that is less than 3 μm.

4. A method of forming a light-emitting diode which is adapted to be integrated wit an integrated circuit, the method comprising:

providing an integrated circuit including a first insulating layer;

depositing a second insulating layer over the first insulating layer, the second insulating layer having an upper surface;

creating a cavity within the second insulating layer;

depositing at least one material in the cavity such that an upper surface of the at least one material is substantially planar with the upper surface of the second insulating layer surrounding the cavity, the at least one material including at least one conductive material;

depositing a first amorphous silicon layer over the second insulating layer such that the first amorphous silicon layer contacts the entire upper surface of the at least one material;

depositing a second amorphous silicon layer over the first amorphous silicon layer; and depositing an electrode over the second amorphous silicon layer.

5. The method of claim 4, wherein depositing at least one material in the cavity comprises depositing at least one material including a metal.

6. The method of claim 4, wherein depositing at least one material in the cavity comprises depositing at least one material including titanium nitride.

7. The method of claim 4, wherein depositing at least one material in the cavity comprises depositing at least one conductive material in the cavity such that the conductive material is directly in electric contact with a conductive area of the integrated circuit.

8. The method of claim 4, wherein depositing the first amorphous silicon layer comprises depositing a lightly-doped silicon layer.

9. The method of claim 4, wherein depositing at least one material in the cavity comprises depositing a metal and a heavily-doped silicon layer.

10. The method of claim 4, wherein depositing the first amorphous silicon layer comprises depositing an undoped amorphous silicon layer with a thickness between 0.35 μm and 1.3 μm.

11. The method of claim 4, wherein depositing the second amorphous silicon layer comprises depositing a doped amorphous silicon layer with a thickness between 10 nm and 30 nm, and having a boron concentration of great than $10^{18}$ atoms/cm$^3$.

12. The method of claim 4, wherein depositing the electrode comprises depositing an ITO layer with a thickness of approximately 80 nm.

13. The method of claim 4, wherein creating the cavity comprises creating a cavity having a square shape.

* * * * *